United States Patent [19]

Sugimoto

[11] Patent Number: 4,626,794
[45] Date of Patent: Dec. 2, 1986

[54] AMPLIFIER CIRCUIT USING A P CHANNEL MOS TRANSISTOR

[75] Inventor: Yasuhiro Sugimoto, Yokohama, Japan

[73] Assignee: Kabushiki Kaisha Toshiba, Kawasaki, Japan

[21] Appl. No.: 726,349

[22] Filed: Apr. 23, 1985

[30] Foreign Application Priority Data

Apr. 26, 1984 [JP] Japan .................................. 59-85020

[51] Int. Cl.$^4$ ........................... H03F 3/16; H03F 3/45
[52] U.S. Cl. .................................... 330/253; 330/257; 330/300

[58] Field of Search .................. 330/149, 253, 7, 277, 330/288, 300

[56] References Cited

U.S. PATENT DOCUMENTS 4,004,245 1/1977 Ochi et al. ........................... 330/253
4,387,309 6/1983 Shacter ........................... 330/253 X Primary Examiner—Eugene R. LaRoche
Assistant Examiner—Steven J. Mottola
Attorney, Agent, or Firm—Finnegan, Henderson, Farabow, Garrett & Dunner

[57] ABSTRACT

In a disclosed amplifier circuit, P channel MOS transistors, as input elements, are connected at the sources to the emitters of bipolar transistors.

2 Claims, 4 Drawing Figures

AMPLIFIER CIRCUIT USING A P CHANNEL MOS TRANSISTOR

BACKGROUND OF THE INVENTION

This invention relates to an amplifier circuit and, more particularly, to an amplifier circuit with a small input current which usually involves a noise problem in low frequencies of the input signal.

Examples of this type of ordinary amplifier circuit are shown in FIGS. 1 and 2. In the amplifier circuit shown in FIG. 1, N channel MOS transistors M1 and M2 form a differential amplifier. V1 and V2 designate power sources with differential terminal voltages $+Vin/2$ and $-Vin/2$, respectively. 10 designates a bias power source for the power sources V1 and V2. An input signal S1 at a differential potential Vin is applied between the gates G1 and G2 of the transistors G1 and G2. Reference numeral 11 designates a current source, and Z1 and Z2 denote loads. Numeral 12 is representative of a power line connected to a high potential Vcc. GND denotes ground. The output voltage Vout of this circuit is derived from the drains of the MOS transistors M1 and M2.

In the circuit shown in FIG. 2, PNP bipolar transistors Q1 and Q2 form a differential amplifier. An input signal S1 is applied between the bases B1 and B2 of these transistors Q1 and Q2. Emitters of the transistors Q1 and Q2 are connected in series to transistors Q3 and Q4, respectively. The output voltage Vout is derived from the collectors of the transistors Q3 and Q4. The bias source 13 is provided for the transistors Q3 and Q4.

In the FIG. 1 circuit, the N channel MOS transistors M1 and M2 are used as input elements. In this type of circuit, the noise power, i.e., 1/f noise, is increased in low frequencies of the input signal. This noise originates from the physical nature of the input elements per se. The N channel MOS transistor causes approximately three times the noise that the P channel transistor causes. Therefore, the FIG. 1 circuit of prior art using the N channel transistor is inappropriate for use in the amplifier operating in audio frequencies.

In the FIG. 2 circuit, the PNP bipolar transistors Q1 and Q2 are used as the input elements. In this type of transistor, the base current flow inevitably and adversely influences the input signal, particularly when the input current is small. The pair of PNP transistors Q1 and Q2, and the pair of NPN transistors Q3 and Q4 are each connected in a complementary fashion. However, it is very difficult to manufacture the transistors of the different polarities with uniform performances.

SUMMARY OF THE INVENTION

Accordingly, the object of this invention is to provide an amplifier circuit which realizes a reduction in the noise caused by the input transistor, improves the frequency response, and produces a stable output signal for a small input current applied.

In the present invention, P channel MOS transistors are used for the input elements. The sources of these transistors are connected to the emitters of bipolar transistors Q11 and Q12. With this arrangement, the input current is negligible, the frequency response is improved, and the noise generated by to the input elements is reduced.

DETAILED DESCRIPTION OF THE PREFERRED EMBODIMENTS

Figure 1:
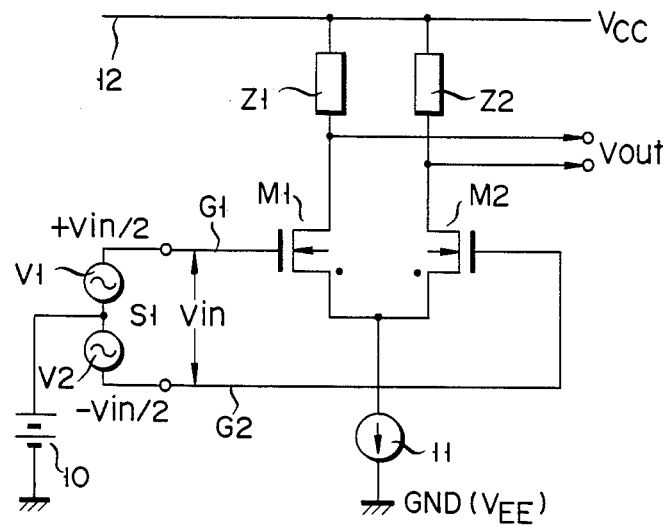
FIGS. 1 and 2 are circuit diagrams of conventional amplifier circuits.
Figure 2:
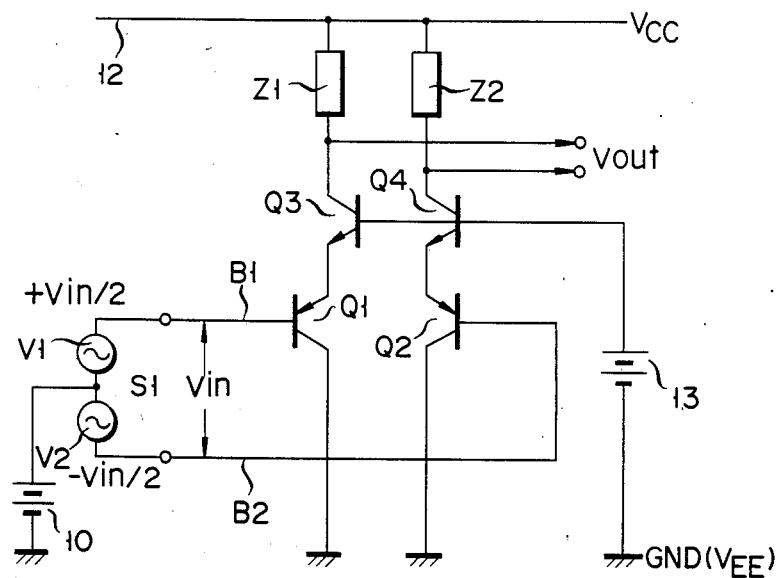
Figure 3:
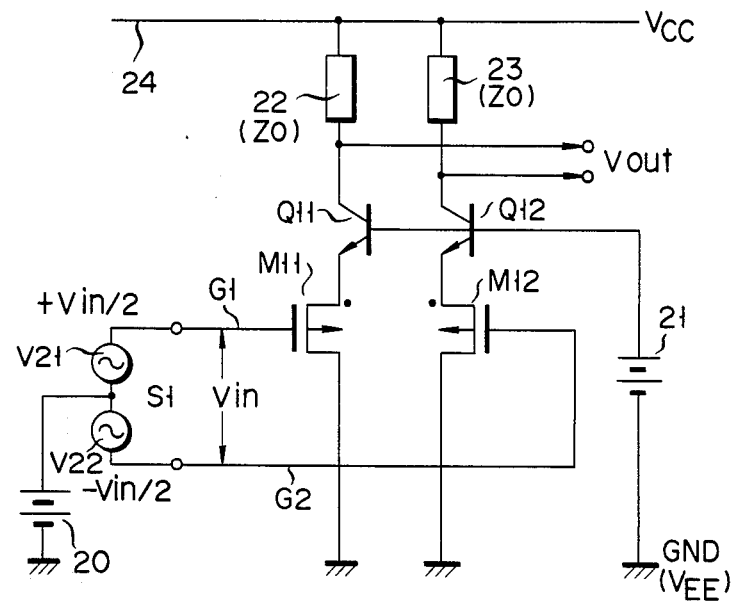
FIGS. 3 and 4 are circuit diagrams of amplifier circuits which are embodiments according to the present invention.

Reference is made to FIG. 3 illustrating a first embodiment of an amplifier circuit according to the present invention. In FIG. 3, a pair of P channel MOS transistors M11 and M12 form a differential amplifier. V21 and V22 designate differential power sources of terminal voltages $+Vin/2$ and $-Vin/2$, respectively. A junction between the power sources V21 and V22 is connected to a positive terminal of a bias power source 20. A negative terminal of the power source 20 is connected to ground GND. An input signal S1 at a potential Vin is connected between the gates G1 and G2 of the MOS transistors M11 and M12. The drains of the transistors M11 and M12 are connected to a lower potential VEE (in this embodiment, it is ground potential GND). The sources of the MOS transistors M11 and M12 are connected to the emitters of NPN bipolar transistors Q11 and Q12, respectively. The bases of the bipolar transistors Q11 and Q12 are connected together to the positive terminal of the bias power source 21. The collectors of these transistors are connected through loads 22 and 23 to a power line 24 coupled with a high potential Vcc. The potential VEE and Vcc constitute a pair of power source potentials. The negative terminal of the bias power source 21 is connected to ground GND. The output signal Vout of this circuit is derived from the collectors of the bipolar transistors Q11 and Q12.

In the above circuit, when the amplitude Vin of the input signal S1 is small, the source potentials of the MOS transistors M11 and M12 are substantially constant. The current flowing into the transistors M11 and M12 is gmVin if the voltage-current converting coefficient is gm. Then, the output voltage Vo is gmzoVin, and the voltage gain vo/vi is gmzo.

When the amplitude Vin of the input signal S1 is small, it can be considered that the voltage between the base and the emitter of each transistor Q11 and Q12 is usually constant. If the transistors M11 and M12 are operating in a saturated region, the currents M11 and M12 flowing into the transistors M11 and M12 are expressed by $$IM1 = (\beta/2) \times (VGSO + Vin/2 - VTH)^2 \quad (1)$$

$$IM2 = (\beta/2) \times (VGSO + Vin/2 - VTH)^2 \quad (2)$$

where $$\beta = \mu \epsilon_{ox} \epsilon_o W / (tox \cdot L)$$

In the above,
- $\beta$: Amplification factor of the transistors M11 and M12.
- $\mu$: Mobility of hole in the transistors M11 and M12.
- $\epsilon_{ox}$: Specific inductive capacity.
- $\epsilon_o$: Inductive capacity.
- tox: Thickness of the gate insulation film in each transistor M11 and M12.

W: Width of the channel of each transistor M11 and M12.

L: Length of the channel of each transistor M11 and M12.

In this case, the output voltage Vout is $$Vout = (IM1 - IM2)Zo \quad (3)$$
$$= \beta(VTH - VGSO)Vin = KVin$$

In the equation (3), VTH is the threshold voltage of each transistor M11 and M12. VGSO is a DC bias voltage between the gate and the source of each transistor M11 and M12. Further, $K=\beta(VTH-VGSO)=$constant.

The equation (3) shows that the FIG. 3 circuit can obtain an amplified output voltage proportional to the input signal.

Figure 4:
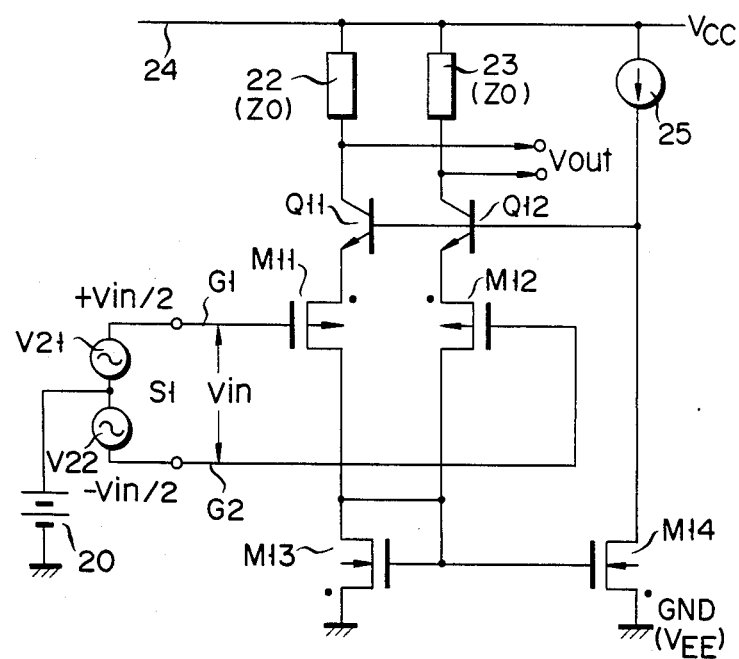

In the circuit of FIG. 4, a bias power source circuit for biasing the NPN transistors Q11 and Q12 is composed of N channel MOS transistors M13 and M14, and a constant current source 25. The remaining circuit arrangement is the same as that of the FIG. 3 circuit. The pair of transistors M13 and M14 provide a current mirror circuit. The MOS transistor M13 is connected between the source of the MOS transistor M11 and ground. The drain of the transistor M13 is connected to the drain of the transistor M11. Its sourse is connected to ground GND. The constant current source 25 and the transistor M14 are connected in series between the power line 24 and ground GND. The constant current source 25 is connected to the power line 24. The transistor M14 is connected to ground. The constant current source 25 is connected at the input to the power line 24, and at the output to the drain of the transistor M14. The junction between the drain of the transistor M14 and the power source 25 is connected to the base of the transistor Q12. The source of the transistor M14 is connected to ground GND. The gates of the MOS transistors M13 and M14 are connected together to the drain of the transistor M12. The gate of the transitor M13 is connected to its drain. The drains of the transistors M11 and M12 serve as input terminals. In the FIG. 4 circuit, unlike the FIG. 3 circuit, it is not connected to ground GND.

The bias circuit thus arranged is of the negative feedback type. In operation, when the DC level at the input is large, and a large current flows into the transistor Q11, the current mirror composed of the transistors M13 and M14 operates to decrease the base potential of the transistor Q11 and to restrict the large current. Therefore, a more stabilized operation of the amplifier circuit is ensured.

It is noted that the input elements are P channel MOS transistors M11 and M12. The 1/f noise of this type of transistor is lower than that of the N channel type MOS transistor. Therefore, if the input signal has a small amplitude and a low frequency, a lower noise is generated and therefore a high quality amplified signal can be obtained. Additionally, this type of transistor is free from base current flow, unlike the bipolar transistor. Therefore, the adverse influence of base current flow on the input current can be removed.

Therefore, even if the input signal is small, a stable amplified output signal can be obtained.

It is further noted that, in the present invention, the source of the P channel MOS transistor M11 is connected to the emitter of the transistor Q11 and the sourse of the P channel MOS transistor M12 is connected to the emitter of the transistor Q12. That is to say, this circuit connection provides a cascade amplifier. Therefore, the gate-source capacitance of each transistor M11 and M12 is extremely small, and the emitter resistance of each transistor is small. The time constant, as defined by the capacitance and resistance, is small. This implies that no mirror capacitance is present, and the frequency response at high frequencies is improved, and therefore the amplifier circuit of the present invention has a good broad band characteristic. In the FIG. 4 circuit arrangement, the P channel MOS transistors and the N channel transistors are combined. This feature provides a preferable sequence of the manufacturing steps when the CMOS-bipolar hybrid technique is used for the IC fabrication. Therefore, effective manufacturing of the amplifier circuits can be realized.

What is claimed is:

1. A circuit for amplifying a differential input signal, comprising:

a high potential power source terminal;

a low potential power source terminal;

a pair of P channel MOS transistors each having a source, a drain, and a gate, said drains being connected to said low potential power source terminal and said gates being connected to receive said differential input signal;

a pair of NPN bipolar transistors each having a base, a collector, and an emitter, said emitters being connected to said sources;

a base bias power source connected to said bases, said base bias power source comprising a current source having an input and an output arranged such that said input is connected to said high potential power source terminal, and a current mirror circuit having first and second inputs and first and second outputs arranged such that said first input is connected between said output of said current source and said bases, such that said second input is connected to said drains, and such that said first and second outputs are connected to said low potential power source terminal; and a pair of loads connected between said collectors and said high potential power source terminal, said collectors providing connection points for obtaining an amplified output signal representing said differential input signal.

2. A circuit according to claim 1, wherein said current mirror circuit comprises first and second N channel MOS transistors, each having a source, a drain, and a gate, said first N channel MOS transistor arranged such that the drain thereof is connected between the gate thereof and the drains of said pair of P channel MOS transistors and the source thereof being connected to said low potential power source terminal, said second N channel MOS transistor arranged such that the drain of said second N channel MOS transistor is connected to said output of said current source, and such that the source of said second N channel MOS transistor is connected to said low potential power source terminal, and the gates of said first and second N channel MOS transistor being interconnected.

* * * * *